United States Patent [19]

Taguchi et al.

[11] 4,424,461
[45] Jan. 3, 1984

[54] SEMICONDUCTOR INTEGRATED CIRCUIT PROVIDING TEMPERATURE COMPENSATION

[75] Inventors: Yasuo Taguchi, Yokohama; Satoshi Nakao, Tokyo, both of Japan

[73] Assignee: Tokyo Shibaura Denki Kabushiki Kaisha, Kawasaki, Japan

[21] Appl. No.: 237,110

[22] Filed: Feb. 23, 1981

[30] Foreign Application Priority Data

Feb. 22, 1980 [JP] Japan .................................. 55-021202

[51] Int. Cl.³ .................... H03K 3/01; H03K 3/26; H01L 31/00; H03F 3/45
[52] U.S. Cl. ................................. 307/491; 307/297; 307/310; 330/256
[58] Field of Search ....................... 307/310; 330/256; 357/28

[56] References Cited

U.S. PATENT DOCUMENTS

| | | | |
|---|---|---|---|
| 3,188,576 | 6/1965 | Lewis, Jr. | 330/256 |
| 3,700,934 | 10/1972 | Swain | 307/310 |
| 3,895,286 | 7/1975 | Steckler | 307/310 |
| 3,899,695 | 8/1975 | Solomon et al. | 307/310 |
| 4,037,106 | 7/1977 | Scheidweiler | 307/310 |
| 4,114,053 | 8/1978 | Turner | 307/310 |
| 4,242,598 | 12/1980 | Johnson et al. | 307/310 |
| 4,260,911 | 4/1981 | Brown, Jr. | 307/310 |
| 4,267,468 | 5/1981 | Hilliker | 307/310 |

Primary Examiner—John S. Heyman
Assistant Examiner—Timothy P. Callahan
Attorney, Agent, or Firm—Cushman, Darby & Cushman

[57] ABSTRACT

A semiconductor integrated circuit is temperature compensated by circuit elements which may be integrated on a typical semiconductor chip. The elements may include resistances formed by different means to have different temperature coefficients so that the collective temperature coefficient of the resistances can be adjusted by changing the values of the resistances.

8 Claims, 4 Drawing Figures

SEMICONDUCTOR INTEGRATED CIRCUIT PROVIDING TEMPERATURE COMPENSATION

BACKGROUND OF THE INVENTION

This invention relates to a semiconductor integrated circuit providing temperature compensation using resistance elements.

It is well-known that the characteristics of semiconductor elements, such as transistors, etc., vary with the surrounding temperature. Accordingly, semiconductor integrated circuits with many, integrally formed elements on semiconductor substrates sometimes do not operate according to specification due to variations in the surrounding temperature. Temperature compensating elements are therefore typically provided in such semiconductor integrated circuits to maintain normal operation. These compensating elements may include diodes having temperature dependent forward voltage characteristics or other discrete elements, such as thermistors. However, traditional compensation requires use of elements which cannot be integrated into a typical semiconductor chip. Thus, chip size must be enlarged.

OBJECT AND SUMMARY OF THE INVENTION

An object of this invention is to provide an improved temperature compensated semiconductor integrated circuit wherein the compensation is performed by circuit elements which may be integrated on a typical semiconductor chip. Temperature compensation is accomplished by providing a plurality of resistance elements which have different temperature coefficients.

BRIEF DESCRIPTION OF THE DRAWINGS

This and other objects and advantages of the invention will become more apparent and more readily appreciated from the following detailed description of the presently referenced exemplary embodiment of the invention taken in conjunction with the accompanying drawing, in which.

DETAILED DESCRIPTION OF THE PREFERRED EMBODIMENT

Figure 1:
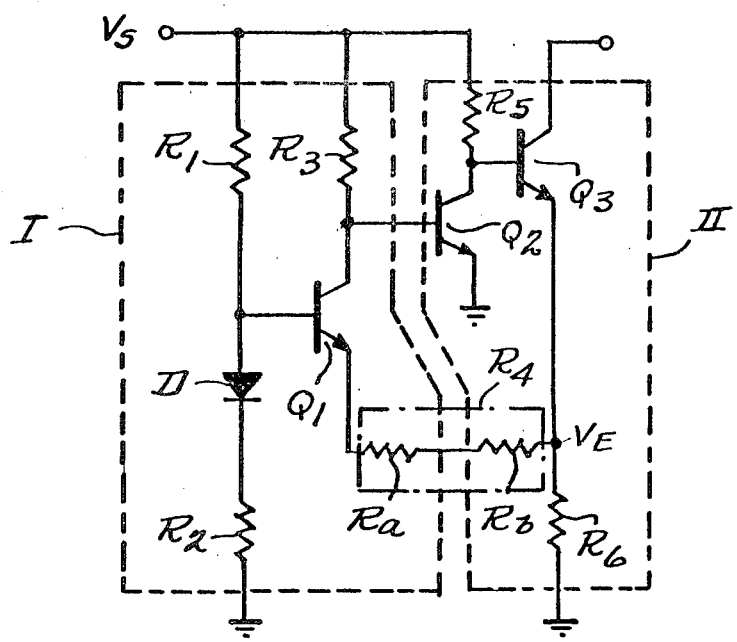
FIGS. 1 and 2 are circuit diagrams of embodiments of this invention.

Referring now to FIG. 1, an embodiment of the present invention as used in a hybrid type semiconductor circuit constant current source will be described. Respective resistances $R_1$, $R_3$, and $R_5$ are coupled between a voltage source $V_s$ and the bases of respective bipolar transistors $Q_1$, $Q_2$, and $Q_3$. The base of transistor $Q_1$ is also connected to the anode of a diode D, which is, in turn, connected to ground through a resistance $R_2$. The collector of transistor $Q_1$ is connected to the base of transistor $Q_2$. The collector and emitter of transistor $Q_2$ are, in turn, connected to the base of transistor $Q_3$ and to ground, respectively. The emitter of transistor $Q_1$ is coupled through a group of series resistances (Ra, Rb), collectively indicated as $R_4$, to the emitter of transistor $Q_3$, and through a resistance $R_6$, to ground. The circuit output is provided at the collector of transistor $Q_3$.

In the operation of the circuit of FIG. 1, transistor $Q_3$ is controlled in accordance with a comparison of the voltage across resistance $R_6$ and a reference voltage, $V_{REF}$, where:

$$V_{REF} = [(V_s - V_{FD})R_2/(R_1 + R_2)] - [(V_s - V_{BEQ2})R_4/R_3]$$

In this equation, $V_{FD}$ is the forward voltage across diode D, and $V_{BEQ2}$ is the base-emitter voltage of transistor $Q_2$. If $V_{REF}$ is greater than VE, transistor $Q_1$ conducts more, transistor $Q_2$ conducts less and transistor $Q_3$ conducts more. Conversely, if $V_{REF}$ is less than VE, transistor $Q_1$ conducts less, transistor $Q_2$ conducts more and transistor $Q_3$ conducts less.

The circuit of FIG. 1 is a hybrid type semiconductor integrated circuit, in that area I (shown by a dotted line) is formed in a semiconductor substrate as a monolithic semiconductor integrated circuit chip and area II (shown by dotted line) is formed independently using thick film technology. Within the circuit, resistance $R_4$ acts as a unitary resistance. However, resistance $R_4$ is formed by two resistances Ra and Rb, one in each area.

In forming the hybrid circuit, the above-mentioned semiconductor integrated circuit chip I is disposed on an insulating substrate, such as ceramic, together with the thick film elements generally indicated as II. Resistances $R_1$, $R_2$, $R_3$ and Ra are formed by impurity diffusion regions in the semiconductor chip. Alternatively, resistor Ra may be formed from polycrystalline silicon. Thick film resistances $R_5$, $R_6$ and Rb are formed by printing a powder material on the insulating substrate and sintering. Carbon, ruthenium oxide, a mixture of palladium oxide and metal or the like may be employed as the powder material. The temperature coefficient of diffusion resistances are generally greater than the temperature coefficient of thick film resistances. For example, the temperature coefficient of a thick film resistance is typically on the order of 200 PPM/degree C. However, the temperature coefficient of a diffusion-type resistance is on the order of 2000 PPM/degree C. Therefore, it is possible to control the temperature characteristic of the above-mentioned voltage $V_{REF}$ by changing the ratio of the values of resistances Ra and Rb.

The amount of change $\Delta R_4$ of the value of resistance $R_4$ with temperature is shown the following equation:

$$\Delta R_4 = \Delta Ra + \Delta Rb$$

$\Delta Ra$ and $\Delta Rb$ are the amounts of change of resistances Ra and Rb, respectively. Consequently, the temperature coefficient $(\Delta R4/R4)$ of resistance $R_4$ is shown as follows:

$$\Delta R4/R4 = (\Delta Ra + \Delta Rb)/R_4 = (Ra/R_4)(\Delta Ra/Ra) + (Rb/R_4)(\Delta Rb/Rb)$$

In this equation, $\Delta Ra/Ra$ and $\Delta Rb/Rb$ are temperature coefficients of resistances Ra and Rb, respectively. Substituting the above-mentioned actual temperature coefficients of Ra and Rb into this equation gives:

$$\Delta R4/R4 = (2000 \text{ PPM})Ra/R_4 + (200 \text{ PPM})Rb/R_4$$

Thus, the value of $\Delta R4/R4$, that is the temperature coefficient of resistance $R_4$, can be controlled within the limits of 200 PPM/degree C to 2000 PPM/degree C. The value of thick film resistance Rb can be adjusted by trimming the resistance.

The purpose of the circuit in FIG. 1 is to produce a constant current. However, without temperature compensation, the current flowing through transistor $Q_3$ will vary with temperature. In order to eliminate this temperature dependence, the value of resistance $R_b$ and/or resistance $R_a$ is varied to vary the temperature coefficient of resistance $R_4$ until the desired degree of temperature independence is achieved.

The embodiment of FIG. 1 employs resistances $R_a$ and $R_b$ connected in series. However, a parallel connection of these resistors can also be effective. Resistance $R_4$ may also be formed by the series and/or parallel connection of three or more resistances.

Figure 2:
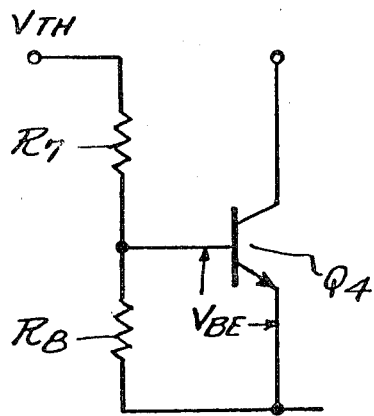

FIG. 2 shows an input circuit which may be made on a single integrated circuit chip. However, the threshold voltage changes with temperature. To stabilize the threshold voltage with respect to temperature, resistances $R_7$ and $R_8$ are made by different processes. Namely, resistance $R_7$ is made by ion implantation, and has a temperature coefficient of 4000 PPM/ degrees C. Resistance $R_8$ is formed in the same region as the base of transistor $Q_4$, and has a temperature coefficient of 2000 PPM/degrees C. The threshold voltage $V_{TH}$ is expressed by the following equation:

$$V_{TH} = V_{BE} \times [(R_7 + R_8)/R_8]$$

Figure 3:
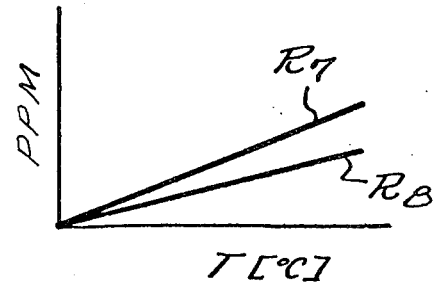
FIG. 3 is a graph showing the temperature coefficients of the resistances in FIG. 2.

The temperature characteristics of resistances $R_7$ and $R_8$ are shown in FIG. 3. The values of resistances $R_7$ and $R_8$ can be adjusted in order to adjust the temperature coefficient of the series combination of $R_7$ and $R_8$ to a value which counterbalances the temperature characteristics of transistor $Q_4$. By this procedure the threshold voltage can be made independent of temperature. Thus, a substantially temperature independent threshold voltage $V_{TH}$ is obtained without requiring the addition of any further elements specifically for temperature compensation.

Figure 4:
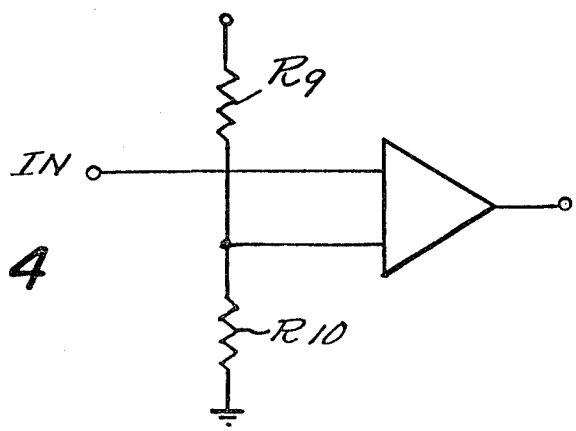
FIG. 4 is a circuit diagram of another embodiment of this invention.

This invention may also use active components in conjunction with resistances that have different temperature coefficients to produce a signal whose value changes with temperature in a predetermined manner. The output of these components can then be used in any application requiring a signal whose value varies with temperature in a known way. The circuit of FIG. 4 is a general comparator having a reference voltage established by a voltage divider formed by resistances $R_9$ and $R_{10}$. However, resistances $R_9$ and $R_{10}$ have different temperature coefficients. Accordingly, the voltage at the reference input of the comparator changes with temperature. By proper choice of the values of resistances $R_9$ and $R_{10}$, the temperature characteristics of the composite device can be controlled. As a result of this improvement, an output that varies in a predetermined way with temperature can be obtained.

Other combinations of resistances may also be employed to form a resistance having an adjustable temperature coefficient. For example, a base resistance and an emitter resistance, ion implantation resistance and polycrystalline silicon resistance, etc. may be employed.

Many changes and modifications can, of course, be carried out without departing from the scope of the present invention, that scope, accordingly, being defined only by the scope of the appended claims.

What is claimed is:

1. A temperature compensated semiconductor integrated circuit comprising:

a first resistance having a first predetermined temperature coefficient;

a second resistance having a second predetermined temperature coefficient different from said first temperature coefficient; and a semiconductor element having a temperature dependent characteristic and being connected to said first and second resistances, said first and second resistances having values which cause a collective temperature coefficient of said first and second resistances to offset said temperature dependent semiconductor element characteristic so that said integrated circuit operates independent of temperature.

2. A temperature compensated semiconductor integrated circuit comprising:

a first resistance having a first predetermined temperature coefficient;

a second resistance having a second predetermined temperature coefficient different from said first temperature coefficient; and a semiconductor element having a temperature dependent characteristic being connected to said first and second resistances, said first and second resistances having values which cause a collective temperature characteristic of said first and second resistances and said semiconductor element to vary in a predetermined way with temperature.

3. A semiconductor integrated circuit as in claim 1 or 2 wherein said first resistance is integrated on a semiconductor chip and said second resistance is a thick film resistance.

4. A semiconductor integrated circuit as in claim 1 or 2, wherein said first and second resistances are integrated on a semiconductor chip.

5. A method of temperature compensating a semiconductor element having a temperature dependent characteristic of a semiconductor integrated circuit comprising the steps of:

biasing said semiconductor element with first and second resistances connected thereto, said first and second resistances connected thereto, said first and second resistances having first and second predetermined temperature coefficients, respectively, which are different from each other; and adjusting the values of at least one of said first and second resistances to adjust a collective temperature coefficient of said first and second resistances to offset said element temperature dependent characteristic so that said integrated circuit operates independent of temperature.

6. A temperature compensated constant current source comprising:

a first semiconductor device having a control electrode, and first and second current carrying electrodes and a temperature dependent characteristic;

means for applying a voltage to said first device control electrode;

a second semiconductor device having a control electrode connected to said first device first current carrying electrode, a first current carrying electrode connected to an output terminal, a second current carrying electrode, and a temperature dependent characteristic; and first and second interconnected resistances, said resistances interconnecting said second current carrying electrodes of said first and second devices, said first and second resistances having different predetermined temperature coefficients, said first and second resistances having values which cause a collective temperature coefficient of said first and second resistances to offset said first and second devices temperature dependent characteristic so that said output terminal is provided with a constant current independent of temperature.

7. A temperature compensated switching device comprising:

a semiconductor element having at least two current carrying electrodes and a control electrode, said current carrying electrodes conducting when a signal applied to said control electrode crosses a temperature dependent threshold;

a first resistance having a first terminal for receiving an input signal and a second terminal connected to said control electrode, said first resistance having a first predetermined temperature coefficient; and a second resistance having a first terminal connected to said control electrode and a second terminal connected to one of said current carrying electrodes, said second resistance having a second predetermined temperature coefficient different from said first temperature coefficient, said first and second resistances having values which cause a collective temperature coefficient of said first and second resistances to offset said semiconductor element threshold temperature dependence so that said switching device switches at a threshold independent of temperature.

8. An amplifier having predetermined temperature characteristics comprising:

an amplifier having a non-inverting terminal, an inverting terminal, and an output terminal, said output terminal having a signal related to the difference between the signals applied to said input terminals and the temperature of said amplifier;

a first resistance having a first predetermined temperature coefficient; and a second resistance having a second predetermined temperature coefficient different from said first temperature coefficient, said first and second resistances being connected in series, one of said input terminals being connected between said first and second resistances, the other of said input terminals receiving an input signal, said first and second resistances having values which cause a collective temperature characteristic of said first and second resistances and said amplifier to vary in a predetermined manner with temperature.

* * * * *